(12) United States Patent
Meyer

(10) Patent No.: US 7,339,237 B2
(45) Date of Patent: Mar. 4, 2008

(54) CONNECTION, CONFIGURATION, AND PRODUCTION OF A BURIED SEMICONDUCTOR LAYER

(75) Inventor: Thorsten Meyer, Munich (DE)

(73) Assignee: Infineon Technologies AG, Munich (DE)

(*) Notice: Subject to any disclaimer, the term of this patent is extended or adjusted under 35 U.S.C. 154(b) by 102 days.

(21) Appl. No.: 11/261,246

(22) Filed: Oct. 28, 2005

(65) Prior Publication Data
US 2006/0131647 A1 Jun. 22, 2006

(30) Foreign Application Priority Data
Oct. 29, 2004 (DE) ........................ 10 2004 052 610

(51) Int. Cl.
| H01L 27/01 | (2006.01) |
|---|---|
| H01L 27/12 | (2006.01) |
| H01L 31/0392 | (2006.01) |
| H01L 29/76 | (2006.01) |
| H01L 29/94 | (2006.01) |
| H01L 31/00 | (2006.01) |

(52) U.S. Cl. .................................... 257/349; 257/335
(58) Field of Classification Search ................ 257/349, 257/335
See application file for complete search history.

(56) References Cited

U.S. PATENT DOCUMENTS

| 2001/0028085 A1* | 10/2001 | Blanchard .................... 257/330 |
| 2001/0048132 A1* | 12/2001 | Ito et al. ..................... 257/330 |
| 2003/0168712 A1* | 9/2003 | Shin et al. ................... 257/510 |

OTHER PUBLICATIONS

Fujishima, N. et al., "A Low On-Resistance Trench Lateral Power MOSFET in a 0.6um Start Power Technology for 20-30 V Applications," IEEE, IEDM, 18.1.1-18.1.4, pp. 455-458 (2002).

* cited by examiner

Primary Examiner—Van Thu Nguyen
Assistant Examiner—Allison P Bernstein
(74) Attorney, Agent, or Firm—Dike, Billig & Czaja, PLLC

(57) ABSTRACT

A power transistor has a semiconductor volume including a plurality of transistor cells connected in parallel, a laterally oriented, highly conductive semiconductor layer buried below the transistor cells in the semiconductor volume, and at least one connection, via which the buried semiconductor layer can be contact-connected from the top side of the power transistor. At least one connection is formed within a trench extending from the top side of the power transistor towards the buried semiconductor layer.

26 Claims, 9 Drawing Sheets

CONNECTION, CONFIGURATION, AND PRODUCTION OF A BURIED SEMICONDUCTOR LAYER

CROSS-REFERENCE TO RELATED APPLICATIONS

This Utility Patent Application claims priority to German Patent Application No. DE 10 2004 052 610.9, filed on Oct. 29, 2004, which is incorporated herein by reference.

BACKGROUND

One embodiment of the invention relates to a power transistor having a semiconductor volume in which a plurality of transistor cells connected in parallel, a laterally oriented, highly conductive semiconductor layer buried below the transistor cells in the semiconductor volume, and at least one connection, via which the buried semiconductor layer can be contact-connected from the top side of the power transistor, are provided. In one embodiment of the invention relates to a power transistor, having a semiconductor volume, in which a plurality of transistor cells connected in parallel and isolated from one another by trenches, a laterally oriented, highly conductive semiconductor layer buried below the transistor cells in the semiconductor volume, and at least one connection, via which the buried semiconductor layer can be contact-connected from the top side of the power transistor, are provided. In one embodiment of invention furthermore relates to a method for producing power transistors of this type.

FIG. 1 illustrates an example of a power transistor in which a laterally oriented, highly conductive semiconductor layer is buried below the transistor cells in the semiconductor volume.

A power transistor 1 has a semiconductor volume 2, in which a $p^-$-doped layer 3, an $n^+$-doped buried semiconductor layer (so-called buried layer) 4, an $n^-$-doped epitaxial layer 5, an $n^+$-doped source region 6, a p-doped body region 7, $n^+$-doped wells 8 and p-doped wells 9 are provided. Gate electrodes 10 are furthermore provided, via which it is possible to generate current flows from the source region 6 into the epitaxial layer 5.

The $n^+$-doped wells 8 serve for contact-connecting the $n^+$-doped buried semiconductor layer 4, while the p-doped wells 9 serve for insulating the buried semiconductor layer 4 and the epitaxial layer 5 from adjacent transistor cells (only one transistor cell is illustrated in FIG. 1).

With respect to the construction illustrated in FIG. 1, the formation of the wells 8 and 9 requires a high temperature budget, since said wells have to reach very deep into the semiconductor volume 2. However, this entails a large lateral extent of the wells 8, 9, whereby the lateral extent of the power transistor 1 is high. The resistance that vertical current flows have to overcome within the buried semiconductor layer 4 constitutes a not inconsiderable proportion of the on resistance of the power transistor 1 and leads to an inhomogeneity of the potential distribution at avalanche, which is tantamount to a lower loading capacity of the power transistor. When a negative drain voltage is present, the buried semiconductor layer 4 injects a relatively large minority current into the substrate ($p^-$-doped layer 3), which current has to be dissipated by means of complicated extraction ring constructions (not shown here) in order that the functioning of adjacent regions (analogue or logic circuit parts) is not disturbed.

SUMMARY

In accordance with one embodiment of the invention, a power transistor has a semiconductor volume, in which:
 a plurality of transistor cells connected in parallel,
 a laterally oriented, highly conductive semiconductor layer ("buried layer") buried below the transistor cells in the semiconductor volume, and
 at least one connection, via which the buried semiconductor layer can be contact-connected from the top side of the power transistor, are provided.

In one case, at least one of these connections is formed within a trench extending from the top side of the power transistor towards the buried semiconductor layer.

The driving-in of highly doped wells into the semiconductor volume can accordingly be obviated; the highly doped wells are replaced by trenches which are partly filled with conductive material. Since the lateral extent of the trenches turns out to be significantly smaller than that of the wells for connection and for insulation of the buried semiconductor layer, the lateral space requirement of the power transistor can be greatly reduced.

In one embodiment, the power transistor is realized as a trench transistor, a gate electrode for switching the power transistor being provided in at least one (cell array) trench, and a connection of the buried semiconductor layer being provided in at least one (cell array) trench. The (cell array) trenches are accordingly used both for accommodating gate electrodes and for forming connections of the buried semiconductor layer. Since trenches have to be etched into the semiconductor volume anyway in the production of trench transistors, a dedicated process step is not necessary for forming the connections, whereby the method for producing the power transistor is simplified.

The distribution of connections and gate electrodes between the trenches may in this case turn out to vary depending on the requirement. By way of example, gate electrodes for switching the power transistor and connections for contact-connecting the buried semiconductor layer may be formed alternately in the trenches. As an alternative to this it is possible to provide both a connection of the buried semiconductor layer and one or more gate electrodes within one trench. By way of example, two gate electrodes between which the connection of the buried semiconductor layer runs through may be provided in one trench, the connection being electrically insulated from the gate electrodes.

In one embodiment, field electrodes are provided in the trenches in which gate electrodes are formed.

In one embodiment, the trenches should reach into the buried semiconductor layer or at least adjoin the latter. Furthermore, one or more trenches may have trench bottoms lined with a highly conductive layer.

The buried semiconductor layer may be surrounded by an insulation ring made of semiconductor material or is embedded in an insulation semiconductor layer, the semiconductor material of the insulation ring or, respectively, of the insulation semiconductor layer being inversely doped with respect to the semiconductor material of the buried semiconductor layer. The insulation ring or, respectively, the insulation semiconductor layer serves for electrically insulating the buried semiconductor layer or the (epitaxial) semiconductor layer arranged thereabove from the surroundings. In this case, the insulation ring or, respectively, the outer edge of the insulation semiconductor layer in which the buried semiconductor layer is embedded constitutes avertical lengthening of a trench ring extending from the top side of the power transistor into the depth of the semiconductor volume. Since the trench ring has only a very small lateral extent, the lateral space requirement of the power transistor can be reduced further. The term "vertical lengthening" does not necessarily mean that the trench ring touches or penetrates into the insulation ring; the trench ring may also be at a distance with respect to the insulation ring.

In one embodiment, a connection for contact-connecting the insulation ring or, respectively, the outer edge of the insulation semiconductor layer from the top side of the power transistor is formed within the trench ring. Undesirable parasitic lateral current flows can thus be prevented in an effective manner. As an alternative to this it is possible for a field electrode insulated from the insulation ring or, respectively, the outer edge of the insulation semiconductor layer to be formed within the trench ring. In both cases, the trench bottom of the trench ring may be lined with a highly conductive layer that functions as a recombination centre and effectively suppresses undesirable parasitic shunt currents.

One embodiment of the invention furthermore provides a power transistor, having a semiconductor volume, in which:
  a plurality of transistor cells connected in parallel and isolated from one another by trenches,
  a laterally oriented, highly conductive semiconductor layer buried below the transistor cells in the semiconductor volume, and
  at least one connection, via which the buried semiconductor layer can be contact-connected from the top side of the power transistor, are provided.

In one case the trenches project into the buried semiconductor layer, the trench bottoms being lined with a highly conductive layer.

Lining the trench bottoms with a highly conductive layer (for example metal) has the effect of increasing the conductivity of the buried semiconductor layer (which makes contact with the highly conductive layer) in these regions, whereby the current that is to be passed in the lateral direction in the buried semiconductor layer has to overcome a lower resistance along the trench bottoms. In this way, it is possible to reduce the on resistance of the power transistor, to put it more precisely that proportion of the on resistance which is caused by the buried semiconductor layer. The highly conductive layer constitutes as it were a low-resistance path via which charge carriers can be conducted into specific regions of the semiconductor body (for example to connections of the buried semiconductor layer).

The trenches may fulfill a wide variety of functions in this case. By way of example, at least one trench may be completely filled with insulating material with the exception of the trench bottom. Furthermore, it is possible for a gate electrode for switching the power transistor to be provided in at least one trench. Furthermore, a field electrode may be provided in at least one trench.

In one embodiment, a connection for contact-connecting the buried semiconductor layer from above is formed within at least one trench extending from the top side of the power transistor towards the buried semiconductor layer. The highly conductive layers lining the trench bottoms should be directly electrically connected to these connections in order to enable the drain current flowing in the buried semiconductor layer to be led away with the lowest possible resistance towards the top via the connections. In one embodiment, the buried semiconductor layer is surrounded by an insulation ring made of semiconductor material or is embedded in an insulation semiconductor layer, the semiconductor material of the insulation ring or, respectively, of the insulation semiconductor layer being inversely doped with respect to the semiconductor material of the buried semiconductor layer.

Furthermore, in one case the insulation ring or, respectively, the outer edge of the insulation semiconductor layer in which the buried semiconductor layer is embedded may constitute a vertical lengthening of a trench ring extending from the top side of the power transistor into the depth of the semiconductor volume.

A connection for contact-connecting the insulation ring or, respectively, the outer edge of the insulation semiconductor layer from the top side of the power transistor may be formed within the trench ring.

The trench bottom of the trench ring may likewise be lined with a highly conductive layer in order to suppress parasitic current flows in the lateral direction.

As already mentioned, a connection for contact-connecting the insulation ring may be provided within the trench ring. As an alternative to this it is possible for a field electrode insulated from the insulation ring or, respectively, the outer edge of the insulation semiconductor layer to be provided within the trench ring.

One embodiment of the invention furthermore provides a method for producing a power transistor in which the buried semiconductor layer and the insulation ring or, respectively, the insulation semiconductor layer in which the buried semiconductor layer is embedded are produced by:
  forming a plurality of trenches in a semiconductor volume, and
  applying dopants to the surface of the semiconductor volume in such a way that dopants enter into the semiconductor volume through the inner walls in the lower region of the trenches.

The application of dopants to the semiconductor volume surfaces may in this case be effected in various ways:
  a) diffusion processes, in which case the dopants can be introduced into the semiconductor volume directly from the vapour phase, or else a layer containing the dopants is applied to the semiconductor volume surface and is subsequently heated, so that the dopants enter into the semiconductor volume from the layer ("coating process"),
  b) implantation processes.

In order to prevent the dopants from also entering into the upper regions of the semiconductor volume, the upper regions of the trench inner walls must be provided with corresponding diffusion barriers or with sidewall implantation buffers prior to the introduction of the dopants.

Prior to the introduction of electrical connections, gate electrodes or insulating material into the trenches, the latter are accordingly used as "access channels" for the implantation of the buried semiconductor layer and of the insulation ring/insulation semiconductor layer. In one case the trenches should lie as close together as possible, so that the individual semiconductor zones that form around the trench bottoms "accrete".

In one embodiment, the insulation ring is indiffused into the semiconductor volume via the inner walls of the trench ring. In order to effect embedding of the buried semiconductor layer into the insulation semiconductor layer, firstly the insulation semiconductor layer is indiffused into the semiconductor volume via the inner walls of all the trenches, and the buried semiconductor layer is subsequently indiffused into the semiconductor volume via the inner walls of all the trenches with the exception of the trench ring in such a way that the insulation semiconductor layer has a higher vertical and/or lateral extent than corresponding extents of the buried semiconductor layer. The higher vertical and/or lateral extent may be brought about for example by virtue of the fact that the formation of the insulation semiconductor layer is effected at a higher implantation energy than the formation of the buried semiconductor layer. As an alternative, the duration of a diffusion process for forming the insulation semiconductor layer is longer than the duration of a diffusion process for forming the buried semiconductor layer. The method described in this section may also be effected on the basis of coating processes or implantation processes in an analogous manner.

As an alternative to this, the trenches may be etched as far as a first depth in a first step, which step suffices for the formation of the buried semiconductor layer, and corresponding dopants are subsequently introduced into the semiconductor volume via the lower part of the inner walls of the trenches. The same trenches are subsequently deepened by means of a further etching process. The insulation semiconductor layer is then formed by introducing corresponding dopants into the semiconductor volume via the lower part of the inner walls of the deepened trenches. The formation of the buried semiconductor layer and of the insulation semiconductor layer is thus effected on the basis of a multistage trench etching process.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
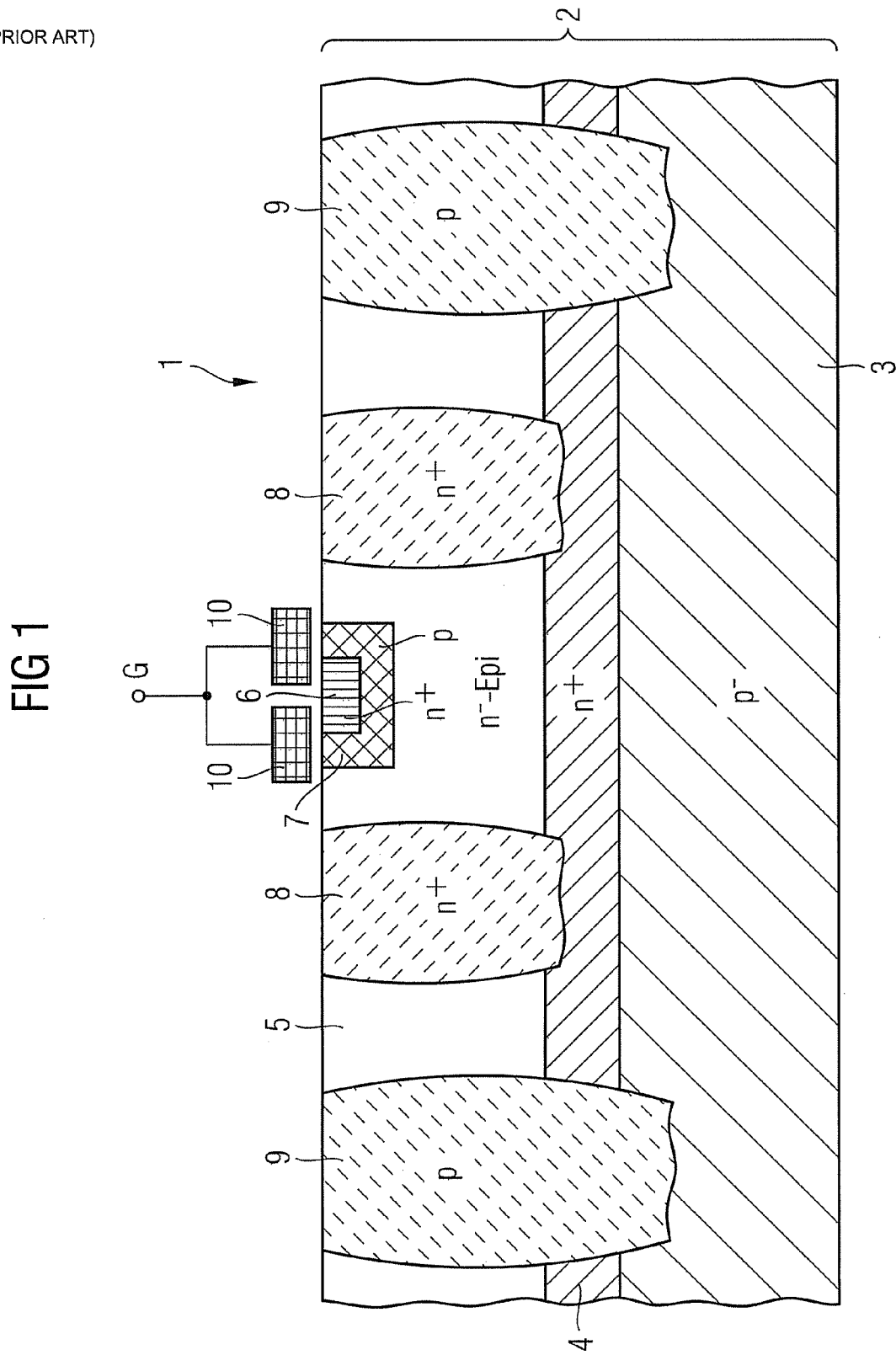
FIG. 1 illustrates a cross-sectional illustration of a power transistor according to the prior art.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the figures, identical or mutually corresponding regions, components or component groups are identified by the same reference numerals. Furthermore, all of the embodiments may be doped inversely, that is to say that n-type regions and p-type regions may be interchanged with one another.

In the following description, one embodiment of the power transistor according to the invention will be explained in more detail with reference to FIG. 2.

Figure 2:
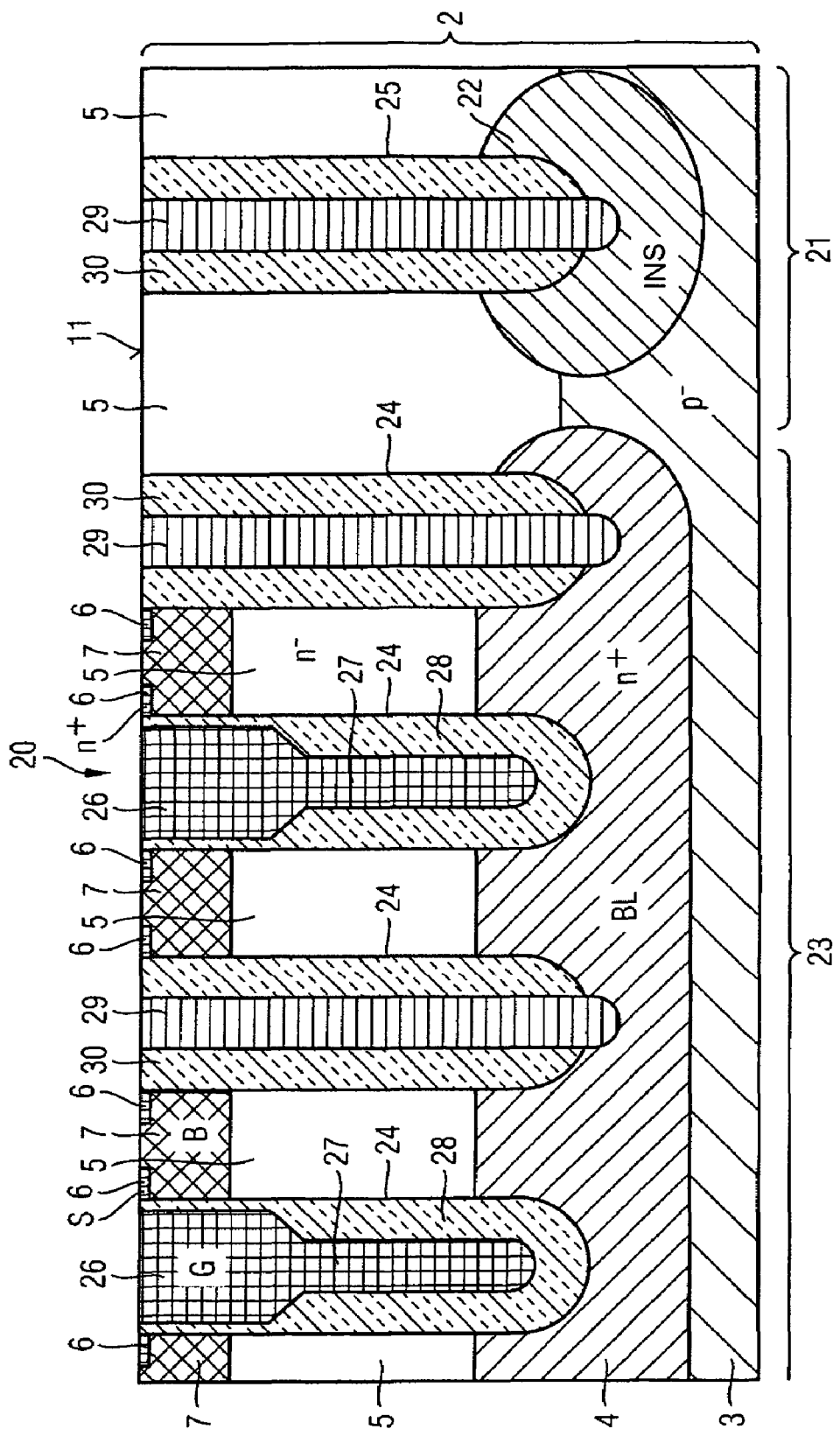
FIG. 2 illustrates a cross-sectional illustration of one embodiment of a power transistor according to the invention.

FIG. 2 illustrates a power transistor 20, in the semiconductor volume 2 of which a $p^-$-doped layer 3, an $n^+$-doped buried semiconductor layer 4 provided on the layer 3, and also an $n^-$-doped epitaxial layer 5 provided on the buried semiconductor layer 4 are formed. Furthermore, a $p^+$-doped semiconductor layer 22 is provided in an edge region 21 of the power transistor 20, which semiconductor layer functions as an insulation ring and in one case encloses the entire cell array 23.

The epitaxial layer 5 is pervaded by cell array trenches 24 reaching right into the buried semiconductor layer 4 (buried layer). An edge trench 25 reaching into the semiconductor layer 22 is furthermore provided. P-doped body regions 7 and $n^+$-doped source regions 6 are provided between the cell array trenches 24. In this embodiment, a gate electrode 26 and a field electrode 27 are provided in every second cell array trench 24. The gate electrodes 26 and the field electrodes 27 are electrically insulated from the semiconductor volume 2 by an insulation layer, for example an oxide 28, the insulation layer 28 being made thinner in the region of the gate electrode 26, and thicker in the region of the field electrode 27. Electrical connections 29 (regions made of conductive material) are formed in the remaining cell array trenches 24, said electrical connections being electrically insulated from the semiconductor volume 2 by an insulation layer 30. The insulation layers 30 are configured with constant thickness, but are pierced by the electrical connections 29 in the region of the trench bottom, said electrical connections reaching beyond the trench bottom right into the buried semiconductor layer 4. Within the edge trench 25 there is likewise an electrical connection 29 provided, which pierces the insulation layer 30 and in this way is in direct contact with the semiconductor layer 22 (the insulation ring).

The electrical connections 29 enable the buried semiconductor layer 4 to be contact-connected in a simple manner, it being possible to choose the number of electrical connections 29 in a manner dependent on the resistance that the lateral current flows have to overcome within the buried semiconductor layer 4. The lateral space requirement of the electrical connections 29 is very small, since the cell array trenches 24 within which the electrical connections 29 run can be made very narrow. The cell array trenches 24 required for the electrical connections can be produced together with the remaining cell array trenches 24 in one process step, whereby there is no need for a dedicated process step for producing the electrical connections 29.

In order to improve the conductivity of the buried semiconductor layer, highly conductive layers may be provided in the trench bottoms of the cell array trenches 24. The highly conductive layers may furthermore be provided at the underside of the electrical connections 29. The same applies analogously to the trench bottom of the edge trench 25 and the underside of the electrical connection 29 provided therein, the highly conductive layer in this case not serving for improving the lateral conductivity, but rather as a recombination centre for undesirable lateral current flows, and thus reinforcing the insulation function of the semiconductor layer 22.

Figure 3:
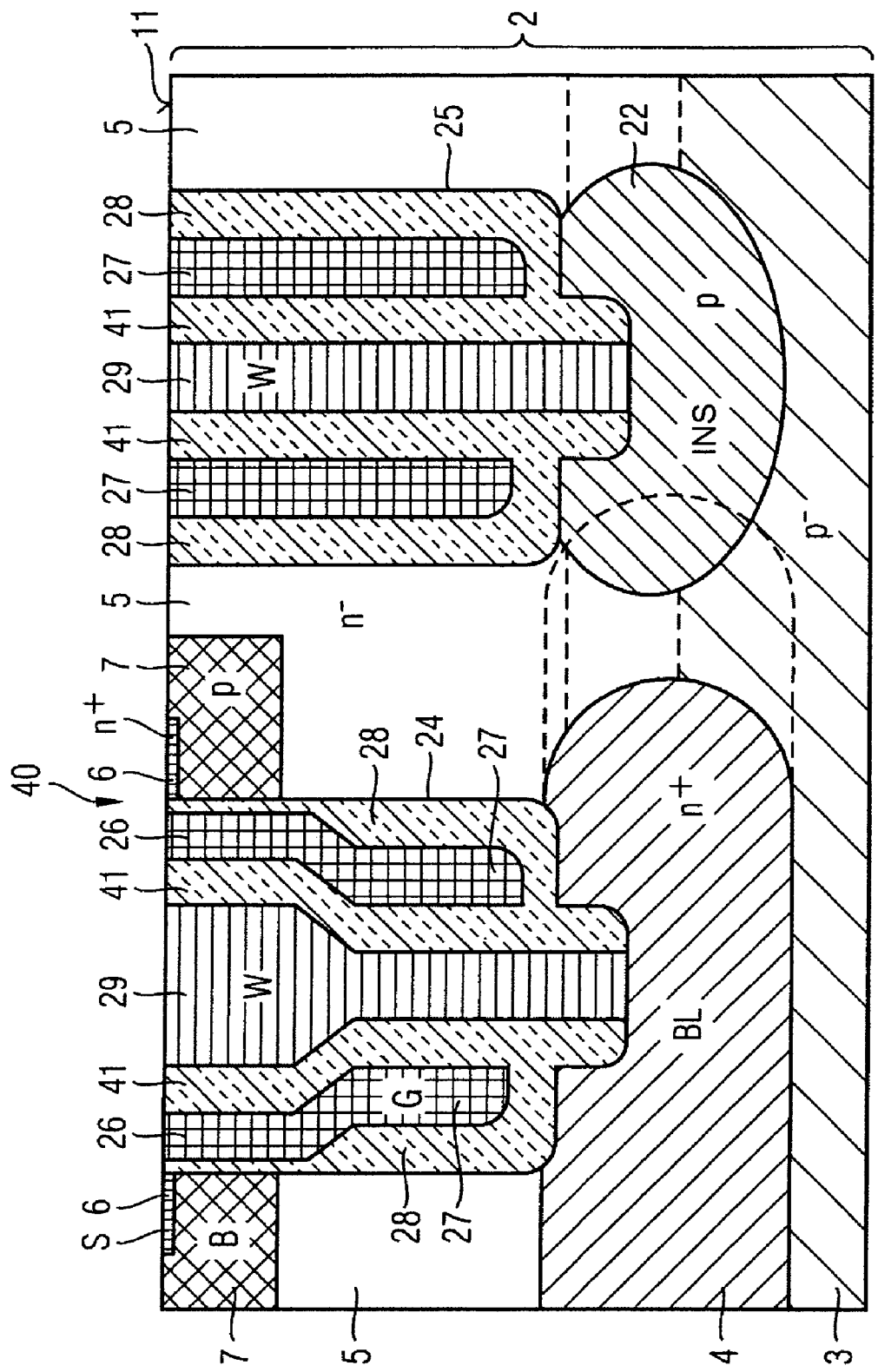
FIG. 3 illustrates a cross-sectional illustration of one second embodiment of a power transistor according to the invention.

FIG. 3 illustrates a further embodiment of the power transistor according to the invention. A power transistor 40 has essentially the construction illustrated in FIG. 2, the gate electrodes 26 and the field electrodes 27 and also the electrical connections 29 not being provided in separate trenches, rather two gate electrodes 26, two field electrodes 27 and one electrical connection 29 being situated in each cell array trench 24. In this case, the electrical connection 29 runs between the gate electrodes/field electrodes 26/27 and is electrically insulated from the latter by means of an insulation layer 41.

Within the edge trench 25 there is likewise an electrical connection 29 provided, which, however, does not run through between two gate electrodes 26 but rather only between two field electrodes 27. This electrical connection 29 is also electrically insulated from the field electrodes 27 by an insulation layer 41. The electrical connections 29 are in direct electrical contact with the buried semiconductor layer 4 and, respectively, the semiconductor layer 22.

Figure 4:
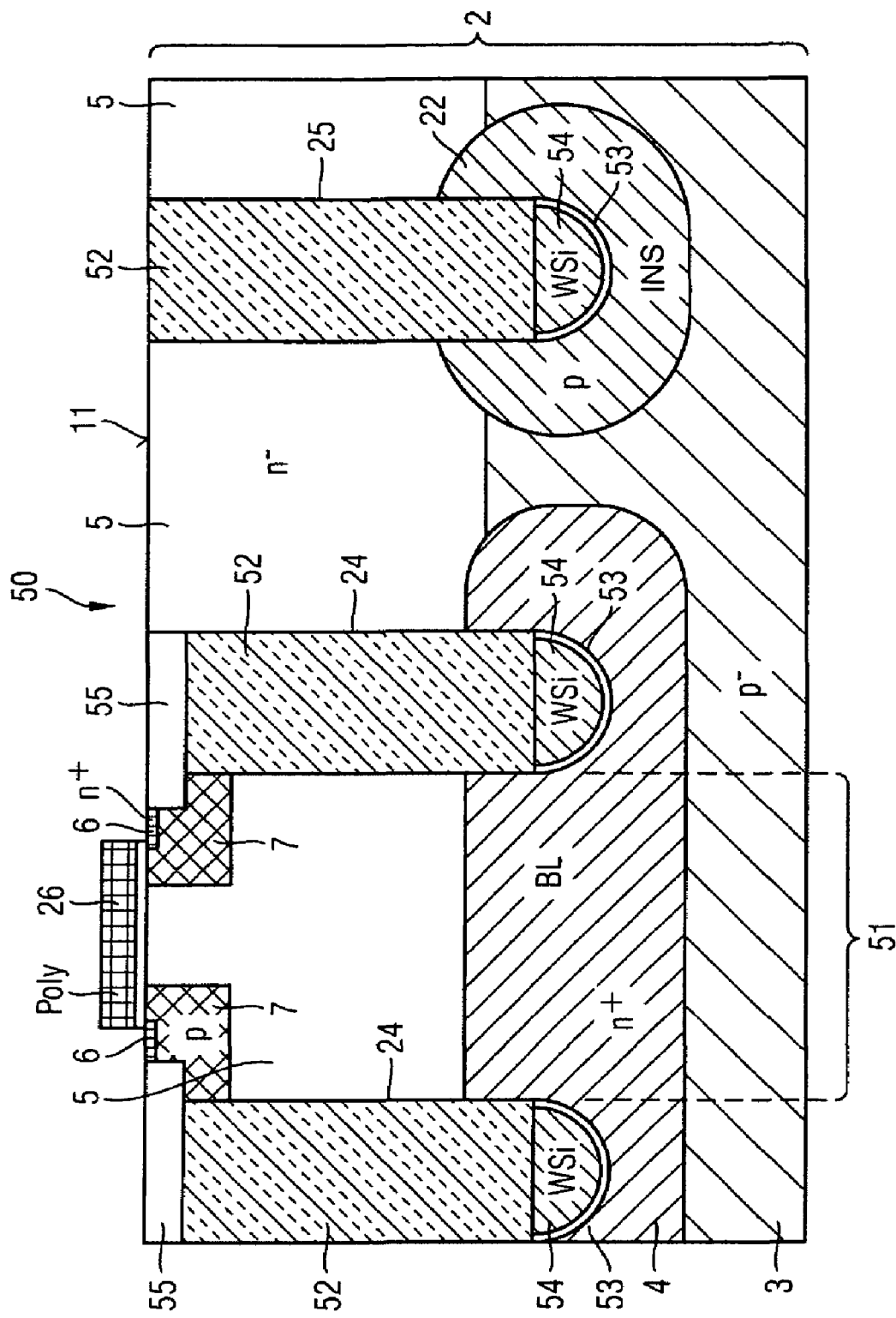
FIG. 4 illustrates a cross-sectional illustration of one embodiment of a power transistor according to the invention.

FIG. 4 illustrates a power transistor 50, in the semiconductor volume 2 of which a plurality of transistor cells 51 are provided, which are isolated from one another by cell array trenches 24. In this embodiment, the cell array trenches 24 and also the edge trench 25 are completely filled with insulating material 52 apart from the lower region. In the lower region of the cell array trenches 24 and of the edge trench 25, to put it more precisely on the respective trench bottoms (which are situated within the buried semiconductor layer 4), a highly conductive layer 53, for example a metal or a silicide, is provided, a layer made of semiconductor material 54 being applied on the highly conductive layer 53 in this embodiment.

The layer 54 made of semiconductor material includes tungsten-silicon, it also being possible to provide; a silicide layer or some other layer made of highly conductive material instead of the layer 54.

The highly conductive layers 53 serve for passing lateral current flows running perpendicular to the plane of the drawing, within the buried semiconductor layer 4, with low resistance to an electrical connection (not shown here) which returns the current upwards to the surface of the semiconductor volume 2. The proportion of the on resistance of the buried semiconductor layer 4 can be noticeably reduced in this way. The purpose of the highly conductive layer 53 within the semiconductor layer 22 is to suppress undesirable shunt currents running horizontally by means of recombination.

Figure 5:
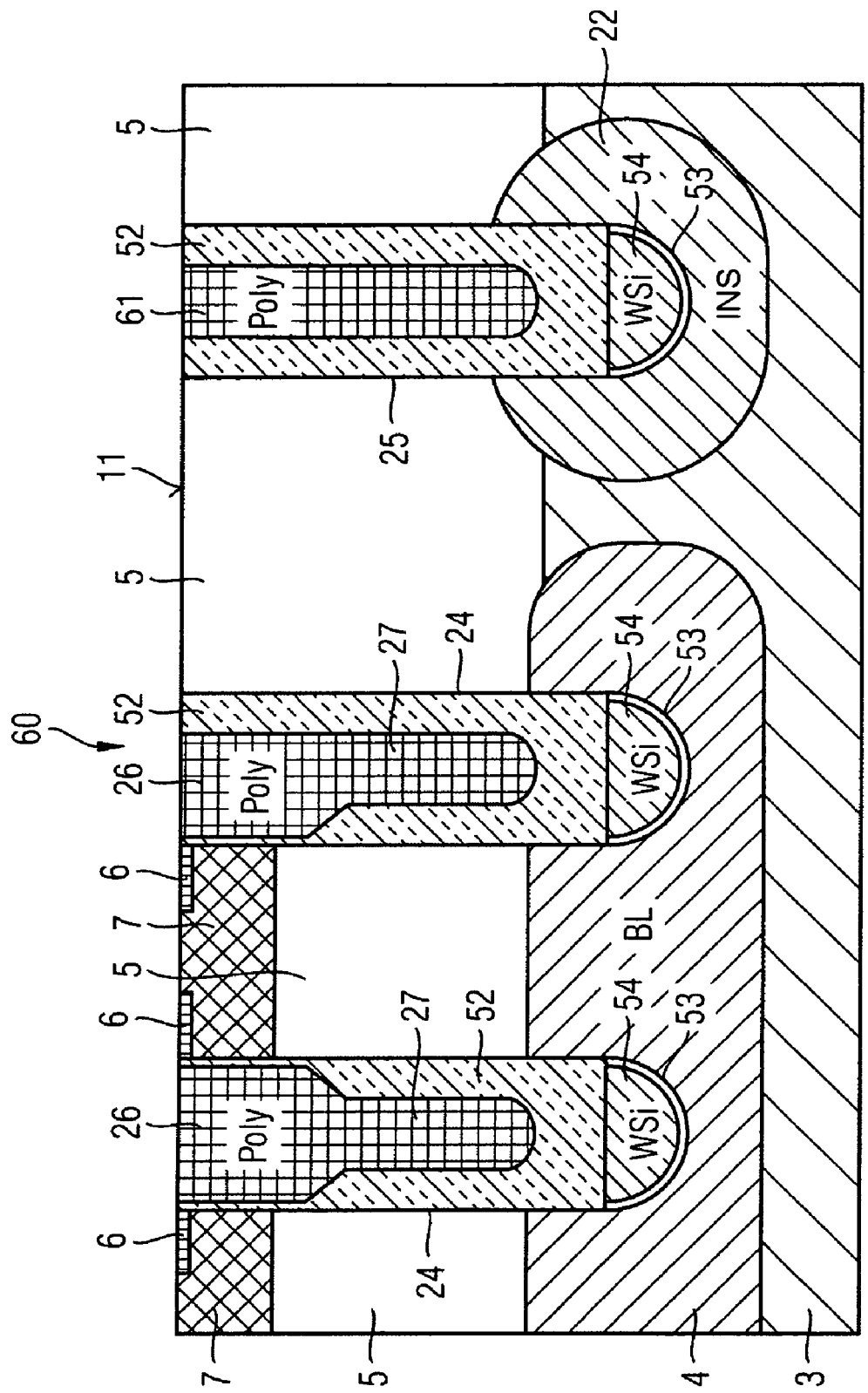
FIG. 5 illustrates a cross-sectional illustration of one embodiment of a power transistor according to the invention.

FIG. 5 illustrates a power transistor 60, the construction of which is similar to the power transistor 50 from FIG. 4. In the power transistor 60, the gate electrodes are formed within the cell array trenches 24, whereas the gate electrodes 26 are arranged above the semiconductor volume 2 in the power transistor 50. The power transistor 50 is a power transistor having a lateral channel, and the power transistor 60 is a power transistor having a vertical channel. A further difference is that a field electrode 61 electrically insulated from the semiconductor volume 2 by the insulating material 52 is provided within the edge trench.

Figure 6:
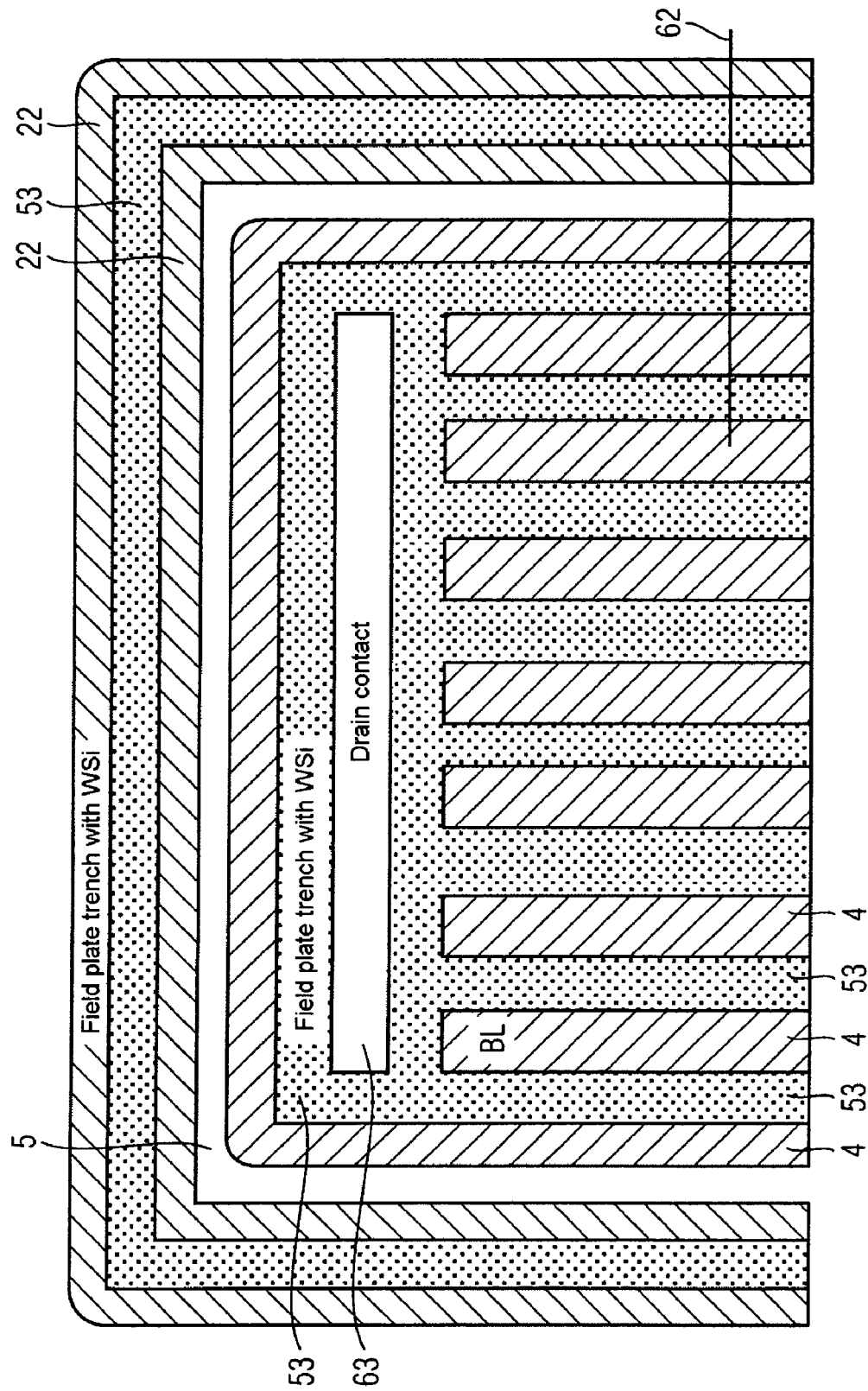
FIG. 6 illustrates a plan view of the embodiment in FIG. 5.

FIG. 6 illustrates a plan view of the power transistor 60, FIG. 6 illustrating the section illustrated in FIG. 5 along the line 62. It can be seen that the highly conductive layers 53 provided in the trench bottoms of the cell array trenches 24 realize low-resistance paths which pervade the buried semiconductor layer 4 and reach as far as an electrical contact 63, which collects the electric currents running into the highly conductive layers 53 and passes them upwards out of the power transistor 60. The lateral conductivity of the buried semiconductor layer 4 can be improved in this way.

FIG. 6 furthermore reveals the semiconductor layer 22 (insulation ring), which surrounds the entire buried semiconductor layer 4 and which is likewise permeated by a continuous ring made of highly conductive material 53.

One embodiment of the method for producing the buried semiconductor layer 4 and also the semiconductor layer 22 will be presented below with reference to FIGS. 7 and 8.

Figure 7:
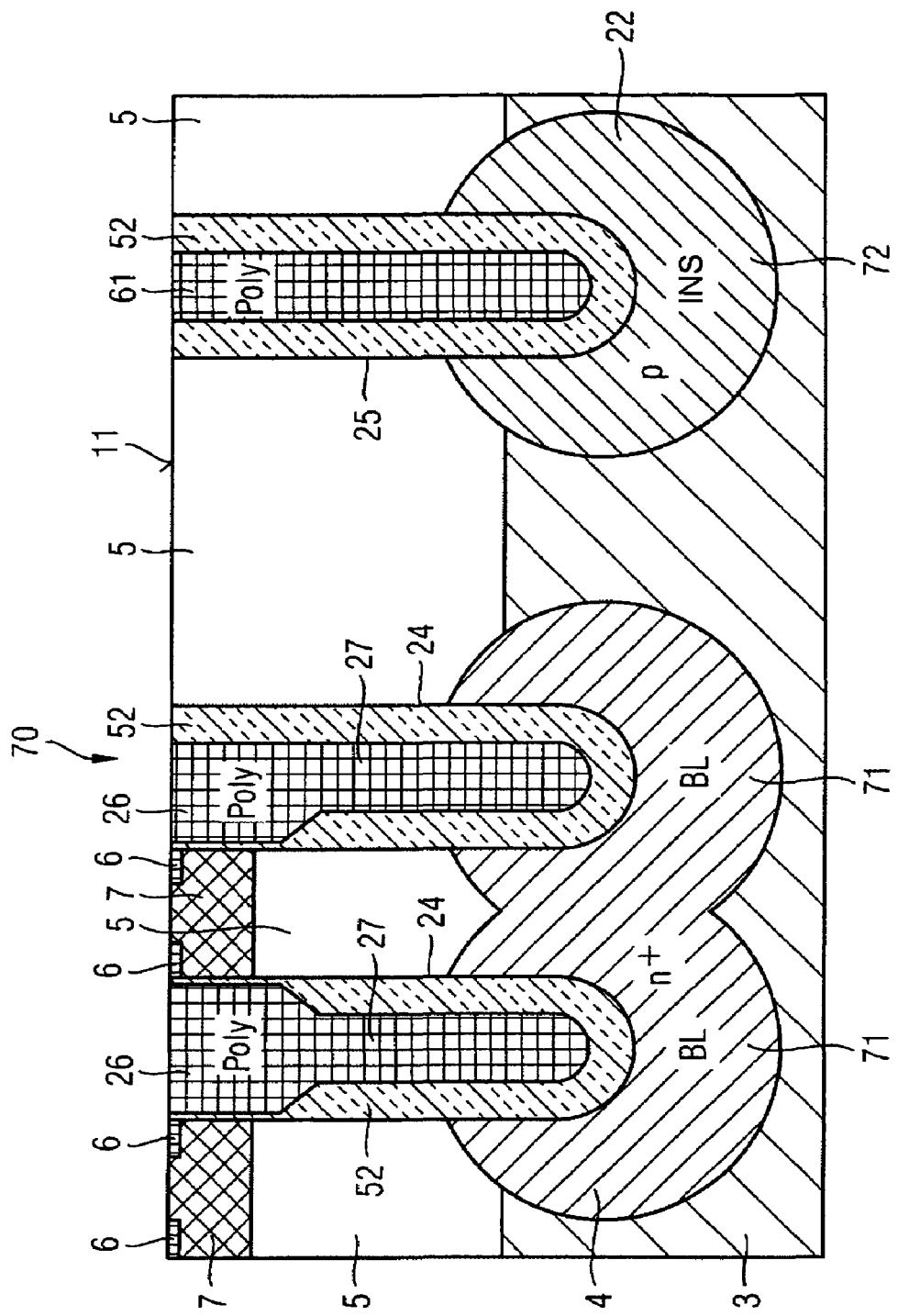
FIG. 7 illustrates a cross-sectional illustration of one embodiment of a power transistor according to the invention.

For this purpose, as can be seen from FIG. 7, firstly cell array trenches 24 and also the edge trench 25 are etched into the semiconductor volume 2. The surface 11 of the semiconductor volume 2 is subsequently subjected to a diffusion process or implantation process, so that dopants enter into the cell array trenches 24 and also into the edge trench 25 (ring trench) and thus enter into the semiconductor volume 2 through the lower part of the inner walls of the cell array trenches 24 and, respectively, of the edge trench 25. In this way, it is possible to produce individual zones 71 of the buried semiconductor layer 4, which merge together with one another after outdiffiasion and form a contiguous buried semiconductor layer 4. For this purpose, in one case, the cell array trenches 24 are not spaced apart too far from one another. A zone 72 of the semiconductor layer 22 is formed around the lower region of the ring trench 25 in an analogous manner.

FIG. 7 illustrates the production of the embodiment illustriated in FIG. 5. In this embodiment, the buried semiconductor layer 4 is enclosed by a ring made of semiconductor material (semiconductor layer 22). As an alternative to this it is possible for the buried semiconductor layer 4 to be completely embedded into a layer made of insulating semiconductor material, as is illustrated in FIG. 8. In order to achieve this, all of the cell array trenches and also the edge trench 25 are exposed to a common diffusion process/implantation process, with the result that the insulation semiconductor layer 73 illustrated in FIG. 8 is produced. The insulation semiconductor layer 73 includes a plurality of semiconductor zones 72 that have merged together with one another.

Only the cell array trenches 24 are then subjected to a diffusion process, thereby producing a buried semiconductor layer 4 embedded in the insulation semiconductor layer. The buried semiconductor layer 4 includes a plurality of semiconductor zones 71 that have merged together with one another. In this case, the formation of the insulation semiconductor layer 73 is effected at higher implantation energies and/or with longer diffusion process durations, which ensures that the penetration depth and also the horizontal extent of the insulation semiconductor layer 73 are greater than in the case of the buried semiconductor zone 4.

Figure 8:
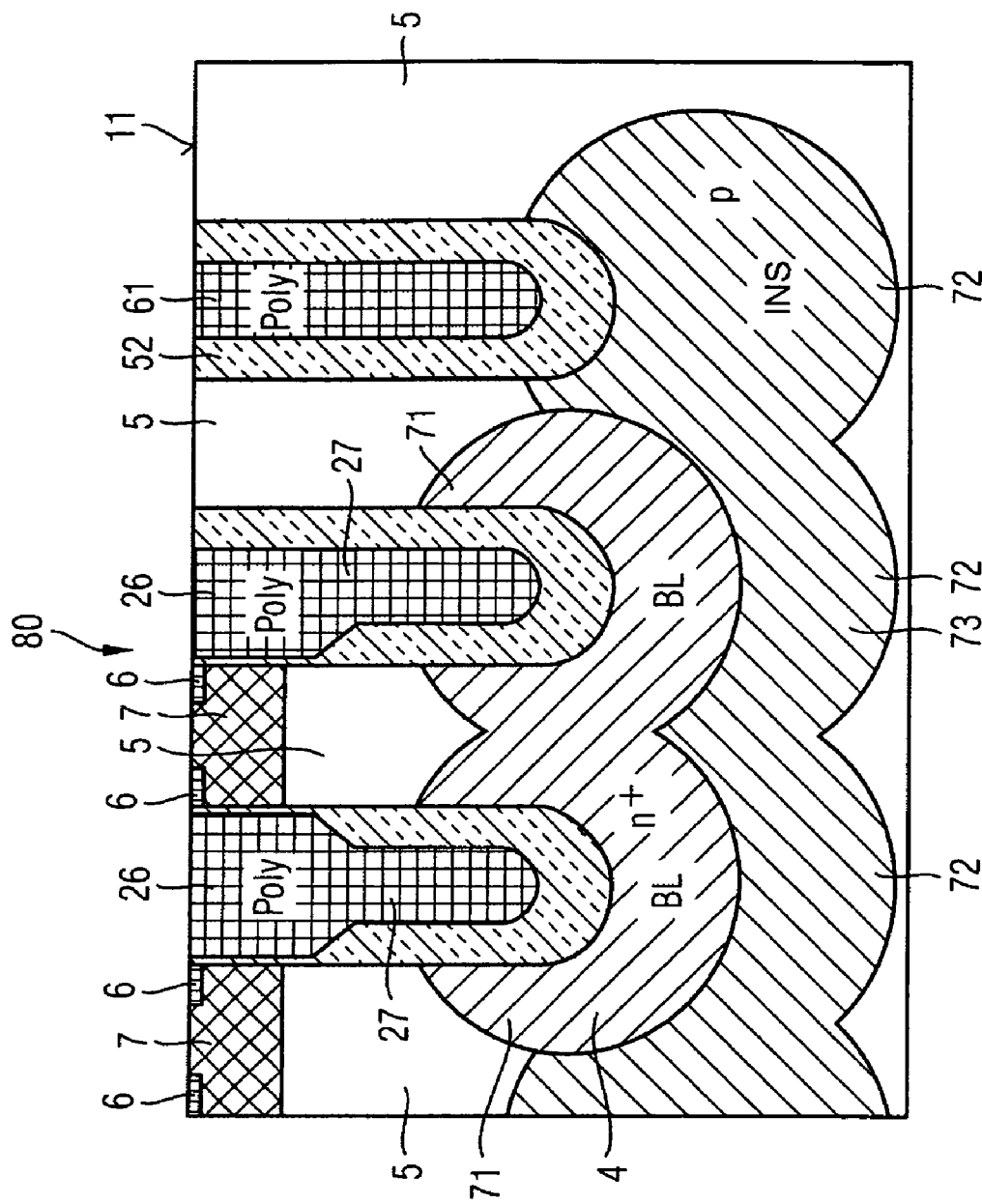
FIG. 8 illustrates a cross-sectional illustration of one embodiment of a power transistor according to the invention.

With respect to the power transistor 80 illustrated in FIG. 8, the semiconductor layer 3 can be dispensed with, whereby the process of depositing an epitaxial layer on a substrate can be obviated.

Figure 9A:
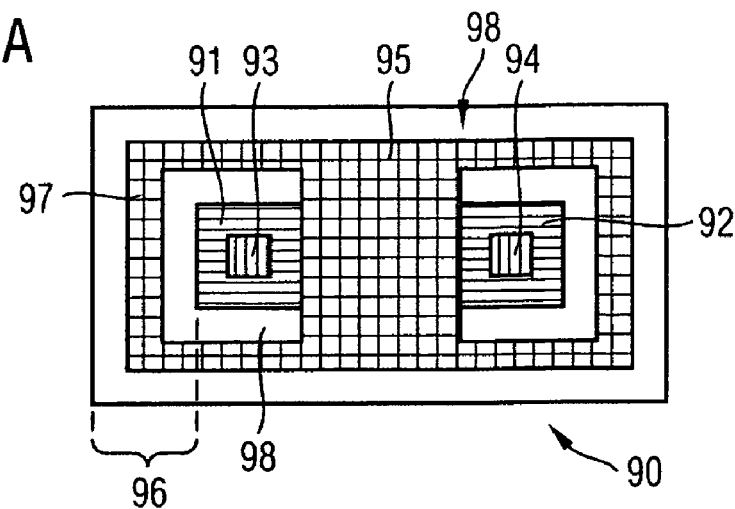
FIGS. 9A to 9C illustrates plan views of components that can be produced by a production method according to embodiments of the invention.

FIG. 9A illustrates a plan view of a low-voltage n-channel MOS transistor 90, which can be produced by means of the production method according to one embodiment of the invention. A source region 91, a drain region 92, a source connection 93, a drain connection 94 and also a gate 95 can be seen. Furthermore, an edge trench 96 lined with thick oxide 98 is provided, which surrounds the entire arrangement and into which a field electrode 97 is provided.

Figure 9B:
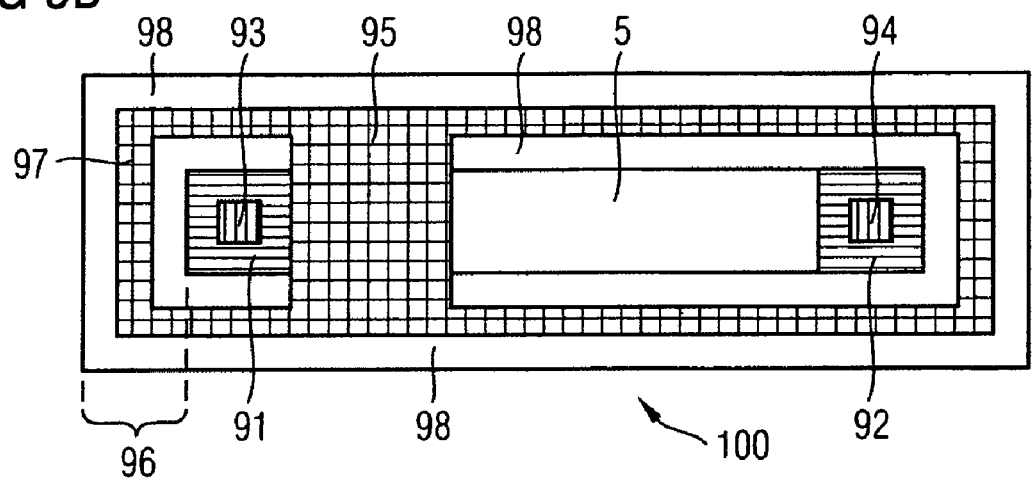

FIG. 9B illustrates a plan view of a high-voltage n-channel MOS transistor 100, the construction of which corresponds, with the exception of the lateral extent, to the construction of the transistor 90 illustrated in FIG. 9A.

Figure 9C:
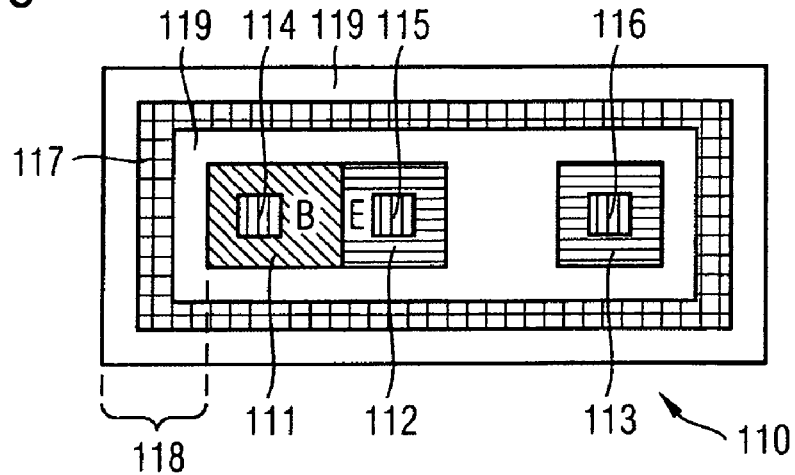

FIG. 9C illustrates a plan view of a vertical npn transistor 110 having a base region 111, an emitter region 112 and also a collector region 113, which are contact-connected by corresponding connections 114 to 116. The entire arrangement is surrounded by an edge trench 118 filled with a field electrode 117, the field electrode 117 being electrically insulated from the rest of the arrangement by thick oxide 119.

Further aspects of the invention will be explained in the following description.

In BCD technologies, a highly doped n-type layer and a highly doped p-type layer have to be introduced in the depth. The former serves as collector for the vertical npn transistor, for suppressing the parasitic substrate pnp transistor and (in the case of a vertical DMOS) for leading away the drain current. The latter serves for the lateral insulation of the n-type wells formed by n-type epitaxial layer and buried layer. These wells have to be electrically connected from the surface.

These wells have hitherto been connected by highly doped wells that have been introduced after deposition of the epitaxial layer from the surface by implantation or coating. In order actually to realize the connection, the wells have to be driven into the depth with a very high temperature budget. As a result, however, they also diffuse out laterally to a very great extent. Therefore, this construction requires a very large amount of silicon area.

If the DMOS is embodied as a field plate trench transistor, then there is the possibility of connecting the buried wells via a highly conductive channel incorporated in the centre of the trench. Said channel has to be electrically insulated from silicon laterally by means of a thick oxide layer and be conductively connected to the silicon in the trench bottom. Said channel may either by provided in a manner electrically insulated from the gate poly in the trench centre or the gate poly itself is used for the connection in a separate trench. In both cases, after shaping the trench field plate, it is necessary to open the oxide in the trench bottom with the aid of a spacer etching in order to produce the electrical contact to the silicon. In order to be able to produce both a p-type contact and an n-type contact, it may be expedient to produce the contact by means of a silicide layer incorporated into the trench bottom.

Since the connection is laterally insulated by oxide, a connection thus requires very little area in comparison with indiffused connection wells. This affords the possibility of connecting the drain of the field plate transistor locally in each or every second trench and thus of constructing a lateral transistor folded into the depth. This as it were vertical LDMOS combines the advantages of the vertical transistor (namely low-resistance, compact transistor cell) with those of the lateral transistor (no ohmic losses through lateral current passing in the depth). At the same time, the p-type insulation can also be connected via the conduction channel in the trench. In this way, it is possible to construct very efficient extraction rings against shunt currents.

One case, therefore, integrates -a field plate trench transistor into a BCD technology and connects the BL via a vertically conductive channel integrated into the field plate trench. This gives rise to a lateral transistor "folded into the depth".

In order to pass the current of the DMOS from the drain situated in the depth to the surface again, hitherto this has involved implanting a highly doped n-type layer prior to deposition of the epitaxy, the buried layer. The sheet resistance of the buried layer firstly makes up a significant proportion of the on resistance of the DMOS. Secondly, it leads to an inhomogeneity in the potential distribution at avalanche, which restricts the robustness of the DMOS. Moreover, a large minority current is injected in the substrate via the buried layer if a negative drain voltage is present. This so-called shunt current has to be dissipated by means of complicated extraction ring constructions to prevent it from flowing into the wells of the analogue or logic circuit parts and disturbing the function of the circuit there.

If the DMOS is embodied as a field plate trench transistor, instead of as a transistor having a planar channel, then it is possible to introduce a highly conductive layer into the trench bottom prior to the processing of the field plate, said highly conductive layer being conductively connected to the silicon. More generally, it is also possible to integrate a trench into a planar transistor embodied in a strip-type design, said highly conductive layer being incorporated at the bottom of said trench.

Said layer serves firstly for leading away the drain current along the trench strips with particularly low resistance. Secondly, the interface of the low-resistance layer forms a very efficient recombination area. The parasitic vertical substrate pnp transistor is suppressed in this way. If, moreover, the lateral insulation of the DMOS is embodied with such a trench, then the interface to the highly conductive trench bottom forms a sink for minorities that suppresses a large part of the shunt current.

With the application of this concept to a field plate trench transistor, the conduction channel at the bottom of the field plate trench does not cost any silicon area.

One possible process sequence for the production of a transistor of this type is as follows:
Buried layer implantation
INS implantation (ring trench)
Epitaxial deposition
Trench etching
Deposition of a tungsten silicide layer in the trench
Filling of the trench with polysilicon
Etching-back of the polysilicon to a defined depth
Removal of the tungsten silicide
Formation of the field plate in the trench
Implantation of planar wells
Gate oxide and poly process As an alternative, the process implementation may also be configured thus:
Buried layer implantation
INS implantation (edge trench)
Epitaxial deposition
Trench etching Field plate oxidation
Opening of the trench bottom with a spacer etching
Selective deposition of tungsten silicide in the trench bottom
Filling of the trench with polysilicon
Etching-back of the polysilicon
Oxidation of the poly plug
Field plate patterning by means of resist plug
Implantation of the planar wells
Gate oxide and poly process The concept can also be applied to a planar transistor in a strip-type design. Silicon area is then lost, however, as a result of the introduction of the trenches.

The highly doped n-type layer (buried layer) and the highly doped p-type layer (INS layer) have hitherto been implanted prior to the deposition of the epitaxy. The presence of these two highly doped layers makes the epitaxial process expensive and difficult to control.

If the DMOS is embodied as a field plate trench transistor, instead of as a transistor having a planar channel, then it is possible to implant both the buried layer and the p-type insulation into the trench bottom prior to the processing of the field plate. For this purpose, the trenches have to be marked in dense fashion, that is to say be at a small distance from one another, both in the DMOS and in the region of the analogue circuit. By means of a temperature budget of suitable magnitude, the individual profiles diffuse together and form continuous buried layer and INS layers. Two variants are possible:

use is made of p$^-$-type basic material with n-type epitaxy. Buried layer and INS are marked alongside one another. That is, for example for a DMOS, that the buried layer is implanted in planar fashion into the active trenches of the DMOS cell array, and that the INS layer is implanted into a closed edge trench around the DMOS cell array.

Use is made of n$^+$-type basic material with n-type epitaxy, the n-type epitaxial layer being considerably thicker than in a conventional BCD process. Buried layer and INS layer are implanted in planar fashion into the trenches of a well. In this case, the INS layer is introduced significantly deeper than the buried layer by means of high-energy implantation. In addition, the INS layer has to be implanted into an edge trench led separately around the well. In an outdiffusion step with a large temperature budget, the individual profiles diffuse together, so that the buried layer and the overlying n-type well are electrically insulated from the substrate. If a negative voltage is then present at the drain, a majority current, rather than a minority current, is injected into the substrate via the vertical buried layer/INS layer/substrate bipolar transistor, which majority current can no longer be collected by other wells.

Since the construction requires the dense arrangement of trenches, all analogue components should be constructed using the trench. In this case, a peripheral trench may respectively be used as component termination. The permissible transistor dimensions must be restricted in a suitable manner in order to ensure a sufficient density of trenches.

Accordingly, one embodiment integrates a field plate trench transistor into a BCD technology and implants the buried profiles of the BCD technology via the trench bottom and diffusing them together.

For the sake of completeness, reference shall be made to the document "A Low On-Resistance Trench Lateral Power MOSFET in a 0.6 μm Smart Power Technology for 20-30 V Applications" by N. Fujishima et al., which has already disclosed contact-connecting a buried semiconductor layer by means of a trench.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power transistor, having a semiconductor volume comprising:
   a plurality of transistor cells connected in parallel;
   a laterally oriented, highly conductive semiconductor layer buried below the transistor cells in the semiconductor volume; and
   at least one connection, via which the buried semiconductor layer can be contact-connected from a top side of the power transistor;
   wherein at least one connection is formed within a trench extending from the top side of the power transistor towards the buried semiconductor layer;
   wherein the buried semiconductor layer is surrounded by an insulation ring made of semiconductor material or is embedded in an insulation semiconductor layer;
   wherein one of the insulation ring and the outer edge of the insulation semiconductor layer in which the buried semiconductor layer is embedded constitutes a vertical lengthening of a trench ring extending from the top side of the power transistor in to the depth of the semiconductor volume; and
   wherein the trench bottom of the trench ring is lined with a highly conductor layer.

2. The power transistor of claim 1, wherein the power transistor is a trench transistor, a gate electrode for switching the power transistor is provided in at least one trench, and a connection of the buried semiconductor layer is provided in at least one trench.

3. The power transistor of claim 2, wherein a field electrode is provided in at least one trench.

4. The power transistor of claim 2, wherein gate electrodes for switching the power transistor and connections for contact-connecting the buried semiconductor layer are formed alternately in the trenches.

5. The power transistor of claims 2, wherein two gate electrodes between which the connection of the buried semiconductor layer runs through are provided in at least one trench, the connection being electrically insulated from the gate electrodes.

6. The power transistor of claim 1, wherein the trenches reach into the buried semiconductor layer and the trench bottoms are lined with a highly conductive layer.

7. The power transistor of claim 1, wherein the semiconductor material of one of the insulation ring and the insulation semiconductor layer is inversely doped with respect to the semiconductor material of the buried semiconductor layer.

8. The power transistor of claim 1, wherein a connection for contact-connecting one of the insulation ring and the outer edge of the insulation semiconductor layer from the top side of the power transistor is formed within the trench ring.

9. The power transistor of claim 1, wherein a field electrode insulated from one of the insulation ring and the outer edge of the insulation semiconductor layer is formed within the trench ring.

10. A power transistor having a semiconductor volume comprising:
a plurality of transistor cells connected in parallel and isolated from one another by trenches;
a laterally oriented, highly conductive semiconductor layer buried below the transistor cells in the semiconductor volume; and
means for contact-connecting the buried semiconductor layer from the top side of the power transistor;
wherein at least one trench reaches into the buried semiconductor layer, the trench bottom of the at least one trench being lined with a highly conductive layer; and
wherein at least one trench is completely filled with insulating material with the exception of the trench bottom.

11. The power transistor of claim 10 further comprising a gate electrode in at least one trench for switching the power transistor.

12. The power transistor of claim 11 further comprising a field electrode in at least one trench.

13. The power transistor of claim 10, wherein a connection for contact-connecting the buried semiconductor layer from above is formed at least within one trench extending from the top side of the power transistor towards the buried semiconductor layer.

14. The power transistor of claim 10, wherein the buried semiconductor layer is surrounded by an insulation ring made of semiconductor material or is embedded in an insulation semiconductor layer, one of the semiconductor material of the insulation ring and the insulation semiconductor layer being inversely doped with respect to the semiconductor material of the buried semiconductor layer.

15. The power transistor of claim 14, wherein one of the insulation ring and the outer edge of the insulation semiconductor layer in which the buried semiconductor layer is embedded constitutes a vertical lengthening of a trench ring extending from the top side of the power transistor into the depth of the semiconductor volume.

16. The power transistor claim 15, wherein a connection for contact-connecting one of the insulation ring and the outer edge of the insulation semiconductor layer from the top side of the power transistor is formed within the trench ring.

17. The power transistor of claim 15, wherein the trench bottom of the trench ring is lined with a highly conductive layer.

18. The power transistor of claim 15, wherein a field electrode insulated from one of the insulation ring and the outer edge of the insulation semiconductor layer is formed within the trench ring.

19. A power transistor having a semiconductor volume comprising:
a plurality of transistor cells connected in parallel and isolated from one another by trenches;
a laterally oriented, highly conductive semiconductor layer buried below the transistor cells in the semiconductor volume; and
means for contact-connecting the buried semiconductor layer from the top side of the power transistor, wherein:
at least one trench reaches into the buried semiconductor layer, the trench bottom of the at least one trench being lined with a highly conductive layer,
the buried semiconductor layer is surrounded by an insulation ring made of semiconductor material or is embedded in an insulation semiconductor layer,
one of the insulation ring and the outer edge of the insulation semiconductor layer in which the buried semiconductor layer is embedded constitutes a vertical lengthening of a trench ring extending from the top side of the power transistor into the depth of the semiconductor volume, and
the trench bottom of the trench ring is lined with a highly conductive layer.

20. The power transistor of claim 19, wherein at least one trench is completely filled with insulating material with the exception of the trench bottom.

21. The power transistor of claim 19 further comprising a gate electrode in at least one trench for switching the power transistor.

22. The power transistor of claim 21 further comprising a field electrode in at least one trench.

23. The power transistor claim 19, wherein a connection for contact-connecting the buried semiconductor layer from above is formed at least within one trench extending from the top side of the power transistor towards the buried semiconductor layer.

24. The power transistor of claim 19, wherein one of the semiconductor material of the insulation ring and the insulation semiconductor layer being inversely doped with respect to the semiconductor material of the buried semiconductor layer.

25. The power transistor of claim 24, wherein a connection for contact-connecting one of the insulation ring and the outer edge of the insulation semiconductor layer from the top side of the power transistor is formed within the trench ring.

26. The power transistor of claim 25, wherein a field electrode insulated from one of the insulation ring and the outer edge of the insulation semiconductor layer is formed within the trench ring.

* * * * *